United States Patent
Chalupa et al.

(10) Patent No.: US 6,366,865 B1
(45) Date of Patent: Apr. 2, 2002

(54) APPARATUS AND METHOD FOR ESTIMATING THE COIL RESISTANCE IN AN ELECTRIC MOTOR

(75) Inventors: Leos Chalupa, Jemnice; Radim Visinka, Olesnice, both of (CZ)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/433,324

(22) Filed: Nov. 3, 1999

(51) Int. Cl.$^7$ ................................................ G01R 27/00
(52) U.S. Cl. ............................. 702/65; 702/64; 702/65; 318/701; 318/727
(58) Field of Search .................. 702/64, 65; 324/76.11, 324/76.12, 76.13, 76.14, 127; 340/664; 318/701, 727, 293, 783, 805, 812, 822, 802; 361/152

(56) References Cited

U.S. PATENT DOCUMENTS

| | | | | |
|---|---|---|---|---|
| 4,451,770 A | * | 5/1984 | Boettner et al. | ............ 318/727 |
| 5,589,754 A | * | 12/1996 | Heikkila | ...................... 318/805 |
| 6,069,467 A | * | 5/2000 | Jansen | .......................... 318/802 |
| 6,249,418 B1 | * | 6/2000 | Bergstrom | .................. 361/152 |

OTHER PUBLICATIONS

Wolff, J.; Rahner, R.; Späth, H.; "Sensorless Speed Control of a Switched Reluctance Motor for Industrial Applications", Proceedings of "Optimization of Electrical and Electronic Equipment", vol. 2, pp. 457–462, Brasov 1998.

* cited by examiner

Primary Examiner—Arthur T. Grimley
Assistant Examiner—Mohamed Charioui
(74) Attorney, Agent, or Firm—Mark J. Fink

(57) ABSTRACT

A controller (40) which estimates the coil resistance (R) of an electric motor (10), receives representations of a voltage (u(t)) across a stator coil (11) and of a current (i(t)) through the coil (11). At first, the controller (40) estimates the magnetic flux ($\Psi_E(t_2)$) in the coil by integrating the difference between u(t) and the product between the current with a preliminary resistance ($\underline{R}$) over a predetermined time interval ($t_1$, $t_2$) in which the coil (11) is energized. Second, the controller (40) calculates a resistance error ($^\Delta R$) using a known actual flux value $\Psi_A(t_2)$ at the end ($t_2$) of the time interval, the previously estimated magnetic flux $\Psi_E(t_2)$ and the integral of the current over the time interval. Third, the calculator derives the coil resistance (R) from the preliminary resistance ($\underline{R}$) and the resistance error ($^\Delta R$).

12 Claims, 3 Drawing Sheets

APPARATUS AND METHOD FOR ESTIMATING THE COIL RESISTANCE IN AN ELECTRIC MOTOR

FIELD OF THE INVENTION

The present invention generally relates to electronic circuits, and more particularly to a motor controller and to a method.

BACKGROUND OF THE INVENTION

Switched Reluctance Motors (SRM) find more and more use, for example, in household appliances (e.g., washing machines, dishwashers, vacuum cleaners), industrial machines, and in cars (starter/generator, window lifter, pumps). The motor has a stator with consecutively switched windings ("coils") creating a rotating magnetic field under control of a microcontroller and semiconductor switches.

For many applications it is desirable to know the actual mechanical position of the rotor in respect to the stator (rotor-to-stator angle). The position can be measured by a mechanical position sensor. However, the sensor would require space (inside or outside the motor), would be coupled by a extra cable (expensive, sometimes shielded), may limit the application scope of the motor (especially for high speed), and may exhibit further disadvantages (e.g., lower reliability). A sensorless position estimator using the microcontroller can be used instead.

A useful reference for construction and operation of a SPM with a sensorless estimator is: "Wolff, J.; Rahner, R.; Späth, H.: 'Sensorless Speed Control of a Switched Reluctance Motor for Industrial Applications', Proceedings of 'Optimization of Electrical and Electronic Equipment', Vol. 2, p. 457–462, Brasov 1998" Wolff et al. describe sensorless position estimation for an industrial motor (power supply 3×400 V/50 Hz) taking into account an assumed value R for the ohmic coil resistance. Compared to the coil voltage, the resulting ohmic voltage drop was small and could have been neglected.

However, for low-voltage applications (e.g., 12 or 24 volts supply in a car), the coil resistance R becomes uneneglectable. Resistance changes during the operation of the motor, for example, an 25% increase from start-up to continuous running duty when the motor is warming up, require a more accurate estimation. While it is possible to derive R for a motor stand-still in a calibration mode, there is a practical requirement to obtain R substantially at any time even if the motor is rotating.

The present invention seeks to provide an improved motor controller operating according to an improved resistance estimation method which mitigate or avoid these and other disadvantages and limitations of the prior art.

DETAILED DESCRIPTION OF A PREFERRED EMBODIMENT

The present invention will be explained in reference to a switched reluctance motor (SRM). This is convenient for explanation, but not necessary for the present invention which can also be applied to other electromechanical devices (e.g., other rotational electric motors, linear electric motors, electromagnets/actuators).

Figure 1:
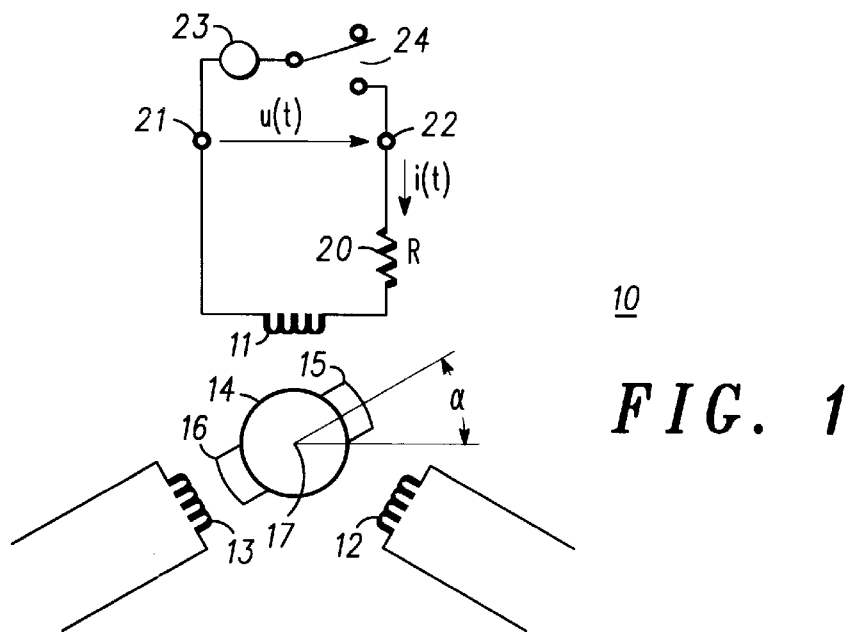
FIG. 1 illustrates a simplified block diagram of a switched reluctance motor (SRM) with stator coils.

FIG. 1 illustrates a simplified block diagram of motor 10 with stator coils 11, 12 and 13. Motor 10 farther comprises rotor 14 having rotor teeth 15 and 16 rotating in center axis 17. The rotor position $\phi$ is indicated by an angle $\phi$ between rotor 14 and stator 11/12/13. The number of coils (e.g., 3) or teeth (e.g., 2) can be changed and coils can be electrically combined to phases (cf. Wolff et al.). Coil 11 is illustrated as being ideal without ohmic resistance. The absolute resistance R of the coil and of the current path to and from the coil is symbolized by serially coupled resistor 20. Further explanation herein conveniently only refers to coil 11 being representative for the other coils. Persons of skill in the art are able, based on the description herein, to estimate the absolute resistance also for coils 12 and 13.

Coil 11 temporarily receives power via terminals 21 and 22, expressed by voltage u(t) and current i(t) ("t" for the time), from voltage source 23 and switch 24.

Figure 2:
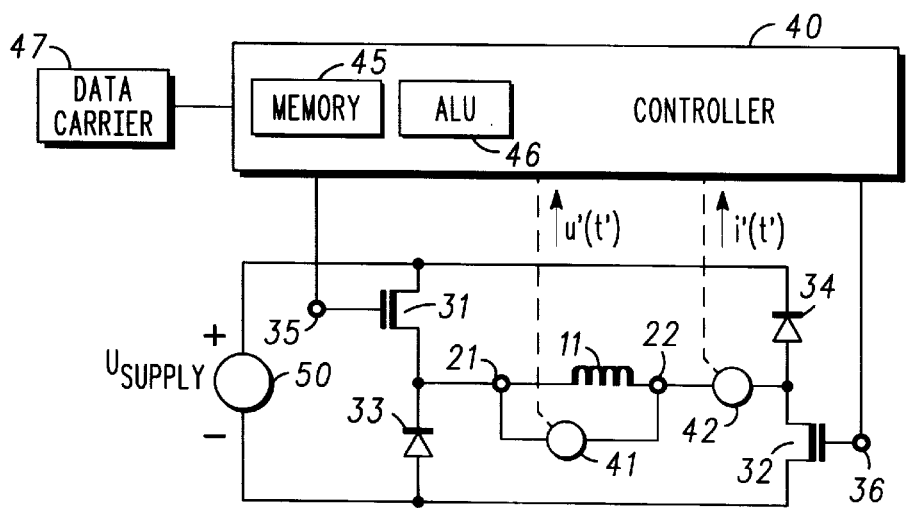
FIG. 2 illustrates a simplified circuit diagram of a coil driver according to the present invention for a stator coil of the motor of FIG. 1.

FIG. 2 illustrates—by way of example—a simplified circuit diagram of coil driver 30 for coil 11 of motor 10 of FIG. 1. Driver 40 comprises controller 40, transistor 31 and 32, diodes 33 and 34, voltage source 50 having positive (plus+) and negative (minus–) terminals providing a supply voltage $U_{SUPPLY}$, electrical sensors 41 and 42 and output terminals 21 and 22 (cf. FIG. 1). FIG. 2 is intended to illustrate only an example; further components for further coils can be added without the need of further explanation.

Transistor 31 has its main electrodes serially coupled between the plus and minus terminals of source 50 via terminal 21 and diode 33. In an opposite arrangement, diode 34 is coupled between plus and minus via terminal 22 End the main electrodes of transistor 32. As in FIG. 1, coil 11 is coupled between terminals 21 and 22.

Controller 40 controls transistors 31 and 32 via terminals 35 and 36, respectively. Preferably, controller 40 is implemented by a microcontroller (also "MCU", or "microprocessor") having memory 45 (e.g., register) to store digital signal representations and controller instructions and having arithmetic unit 46 (ALU) to perform calculations. Also illustrated in FIG. 2 is data carrier 47 with a computer program comprising microcontroller instructions.

Transistor 31 and 32 can be, for example, IGBTs each having a drain and a source as main electrodes and a gate as control electrode. Other types, such as field effect transistors (FETs) or bipolar transistors can also be used.

Voltage sensor 41 across terminals 21 and 22 and current sensor 42 which are serially coupled to coil 11 (e.g., between the anode of diode 34 and terminal 22) provide digital representations u'(t') of u(t) and i'(t') of i(t). Sensors 41 and 42 can be implemented by analog-to-digital converters (ADCs) well known in the art. The prime markers indicate that sensors 41 and 42 preferably provide the representations by sampling at discrete time points. Representations u'(t) and i'(t') are transmitted to controller 40 (dashed lines). This is convenient for digital data processing by the microcontroller, but not essential. Persons of skill in the art can process u(t) and i(t) also by analog circuitry. It is further possible to couple sensors 41 and 42 differently, for example, to include the voltages across and/or the current paths through the main electrodes of transistors 31 and/or 32.

Figure 3:
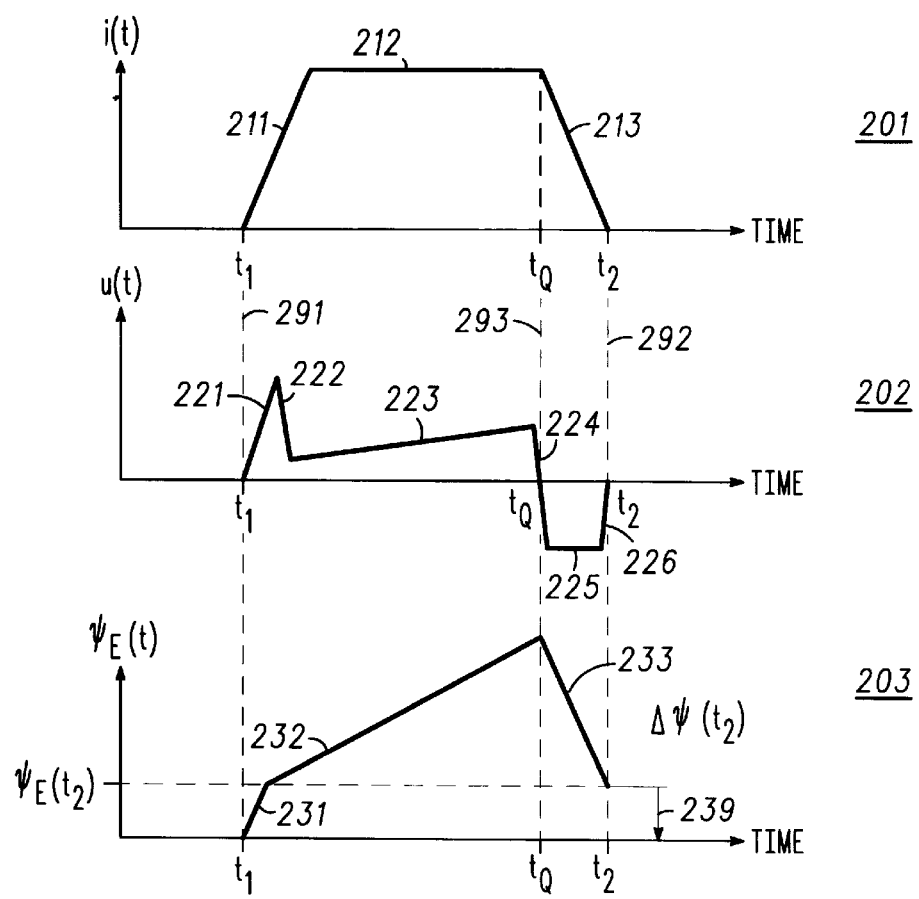
FIG. 3 illustrates simplified time diagrams of a current, a voltage, and an estimated magnetic flux occurring in the stator coil.

FIG. 3 illustrates simplified time diagrams 201–203 of measured current i(t), measured voltage u(t), and estimated magnetic flux $\Psi_E(t)$, respectively in coil 11 of FIGS. 1–2. In combination, the diagrams also illustrate how controller 40 of the present invention obtains the coil resistance R which is related to current, voltage and flux. For calculations, where the resistance R is not yet known, or where intermediate values are used for calculation, a "preliminary" resistance $\underline{R}$ is expressed by underscoring. By definition, $\underline{R}$ is related to R via an resistance error $^\Delta R$, that is:

$$\underline{R} = R + {}^\Delta R \tag{1}$$

This definition can be changed, for example, by changing the plus symbol to a minus symbol without departing from the present invention.

Diagrams 201–203 of FIG. 2 illustrate the time t horizontally. Vertical dashed lines 291, 293 and 292 are common in all diagrams to indicate time points $t_1$, $t_Q$ and $t_2$, respectively. For simplicity of explanation, magnitudes of i(t), u(t) and $\Psi_E(t)$ before $t_1$, and after $t_2$ are not discussed.

Referring to diagram 201, time point $t_1$ is defined as the moment when driver 30 switches on coil 11 by making conductive transistors 31 and 32. From $t_1$, driver 30 pulse code modulates the energy supply to coil 11 so that current i(t) increases (trace 211) and then, as in the example, substantially remains constant (trace 212). Time point $t_1$ can be chosen when motor 10 is being started up or—in a steady state—when rotor 16 has already performed any number of rotations. At about $t_Q$, driver 30 stops supplying energy to coil 11 so that i(t) decreases (trace 213). Time point $t_2$ is defined as the moment when current i(t) reaches zero, that is $$i(t_2) = 0 \tag{2}$$

Current i(t) is an average value resulting from repeatedly switching on and off coil 11 by transistors 31 and 32. Depending on the rotation speed of motor 10 (i.e. dφ/dt), the shape of current i(t) can be different; but this is not essential for the present invention.

Referring now to diagram 202, voltage u(t) can rise after $t_1$ (trace 221), fall again (trace 222), rise (trace 223), fall after $t_Q$ (trace 224) to negative, stay (trace 225) and rise again to reach zero at about $t_2$ (trace 226). Other shapes are also possible, wherein the shape is not essential for the present invention. As persons of skill in the art understand, current and voltage are closely related.

Referring now to diagram 203, the estimated magnetic flux $\Psi_E(t)$ at any time point t is now given as the following integral from $t_1$ to t:

$$\Psi_E(t) = \int_{t_1}^{t} [u(\vartheta) - \underline{R} * i(\vartheta)] d\vartheta + \Psi_A(t_1) \tag{3}$$

wherein the symbol $\vartheta$ conveniently stands for the time. The subscript "E" stands for "estimate" and indicates that the magnitude of the flux can differ from an actual magnitude $\Psi_A(t)$ (subscript "A" for "actual") which is physically present at coil 11 (details later).

Beginning with $t_1$ the flux increases until about $t_Q$ (traces 231 and 232) and decreases until $t_2$ (trace 233). The previous equation (2) leads to flux value $\Psi_E(t_2)$ at time point $t_2$, that is:

$$\Psi_E(t_2) = \int_{t_1}^{t_2} [u(\vartheta) - \underline{R} * i(\vartheta)] d\vartheta + \Psi_A(t_1) \tag{4}$$

Within the time frame $t_1$ and $t_2$, which is shorter than the time needed by rotor 14 for a single fill turn, coil resistance $\underline{R}$ is assumed to remain constant, that is $$\underline{R}(t_1) = \underline{R}(t_2) \tag{5}$$

Equation (4) is rewritten as:

$$\Psi_E(t_2) = \underbrace{\int_{t_1}^{t_2} u(\vartheta) d\vartheta}_{(6.1)} - \underbrace{R * \int_{t_1}^{t_2} i(\vartheta) d\vartheta}_{(6.2)} - \underbrace{{}^\Delta R * \int_{t_1}^{t_2} i(\vartheta) d\vartheta}_{(6.3)} + \underbrace{\Psi_A(t_1)}_{(6.4)} \tag{6}$$

Terms (6.1), (6.2) and (6.4) stand for the actual value $\Psi_A(t_2)$ physically present at coil 11 at time point $t_2$, that is $$\Psi_A(t_2) = \underbrace{\int_{t_1}^{t_2} u(\vartheta) d\vartheta}_{(6.1)} - \underbrace{R * \int_{t_1}^{t_2} i(\vartheta) d\vartheta}_{(6.2)} + \underbrace{\Psi_A(t_1)}_{(6.4)} \tag{7}$$

Term (6.3) represents a flux error which is conveniently abbreviated as:

$$\Delta\Psi(t_2) = -{}^\Delta R * \int_{t_1}^{t_2} i(\vartheta) d\vartheta \tag{8}$$

Writing $\Psi_A(t_2)$ instead of terms (6.1) and (6.2) and writing (6.3) by the delta, equation (6) is expressed as:

$$\Psi_E(t_2) = \Psi_A(t_2) + \Delta\Psi(t_2) \tag{9}$$

$$\Delta\Psi(t_2) = \Psi_E(t_2) - \Psi_A(t_2)$$

This delta definition can be reversed, affecting only the sign.

For rotor 14 without built in permanent magnets, the actual value of $\Psi_A(t_2)$ and $\Psi_A(t_1)$ is zero, that is $$\Psi_A(t_2) = 0; \quad \Psi_A(t_1) = 0 \text{ (case i)} \tag{10}$$

In other words, in that case the flux error $\Delta\Psi(t_2)$ equals $\Psi_E(t_2)$ which is indicated in diagram 203 by arrow 239, that is:

$$\Delta\Psi(t_2) = \Psi_E(t_2) \text{ (case i)} \tag{11}$$

For a rotor 14 comprising permanent magnets, the actual values $$\Psi_A(t_2) \neq 0; \quad \Psi_A(t_1) \neq 0 \text{ (case (ii))} \tag{12}$$

can be calculated or measured once at the design stage of motor 14 and is therefore known to controller 40 at any time. In other words, $\Psi_A(t_2)$ for case (ii) is substantially determined by the magnetic permeability of rotor 14.

For both cases (i) and (ii), resistance error $^\Delta R$ can be obtained according to:

$$^\Delta R = -\frac{\Delta\Psi(t_2)}{\int_{t_1}^{t_2} i(t) dt} \tag{13}$$

which can also be expressed as (cf. equation (9)):

$$\Delta R = \frac{\Psi_A(t_2) - \Psi_E(t_2)}{\int_{t_1}^{t_2} i(t)dt} \quad (14)$$

Similar as above, the definition of $^\Delta R$ can be modified by changing the sign. Persons of skill in the art can perform the calculations for $\Psi_E(t_2)$, $^\Delta R$ using the above mentioned digital current i'(t') and voltage u'(t') representations provided by sensors 41 and 42, respectively, without the need further explanation herein, for example, by replacing the time continuous integral ∫ dϑ of equation (4) by a time discrete sum$^\Sigma$ over t'.

Using definition (1), resistance R can be now be calculated, that is:

$$R = \underline{R} - \Delta R \quad (15)$$

In the example of FIG. 2, $\underline{R}$ is smaller than R, the term "−R*i" in equation (4) is not strong enough to estimate zero flux at $t_2$. Instead, $^{\Delta\Psi}(t_2)$ is positive (downward pointing arrow 239) and $^\Delta R$ becomes negative (equation 13). By applying definition (1)(14) again, the correct value R higher than $\underline{R}$ is obtained.

Modifications of the scheme are possible. For example, the calculations can be based on time points $t_X$ before or after $t_2$ where the actual flux $\Psi_A(t_X)$ is also known.

Figure 4:
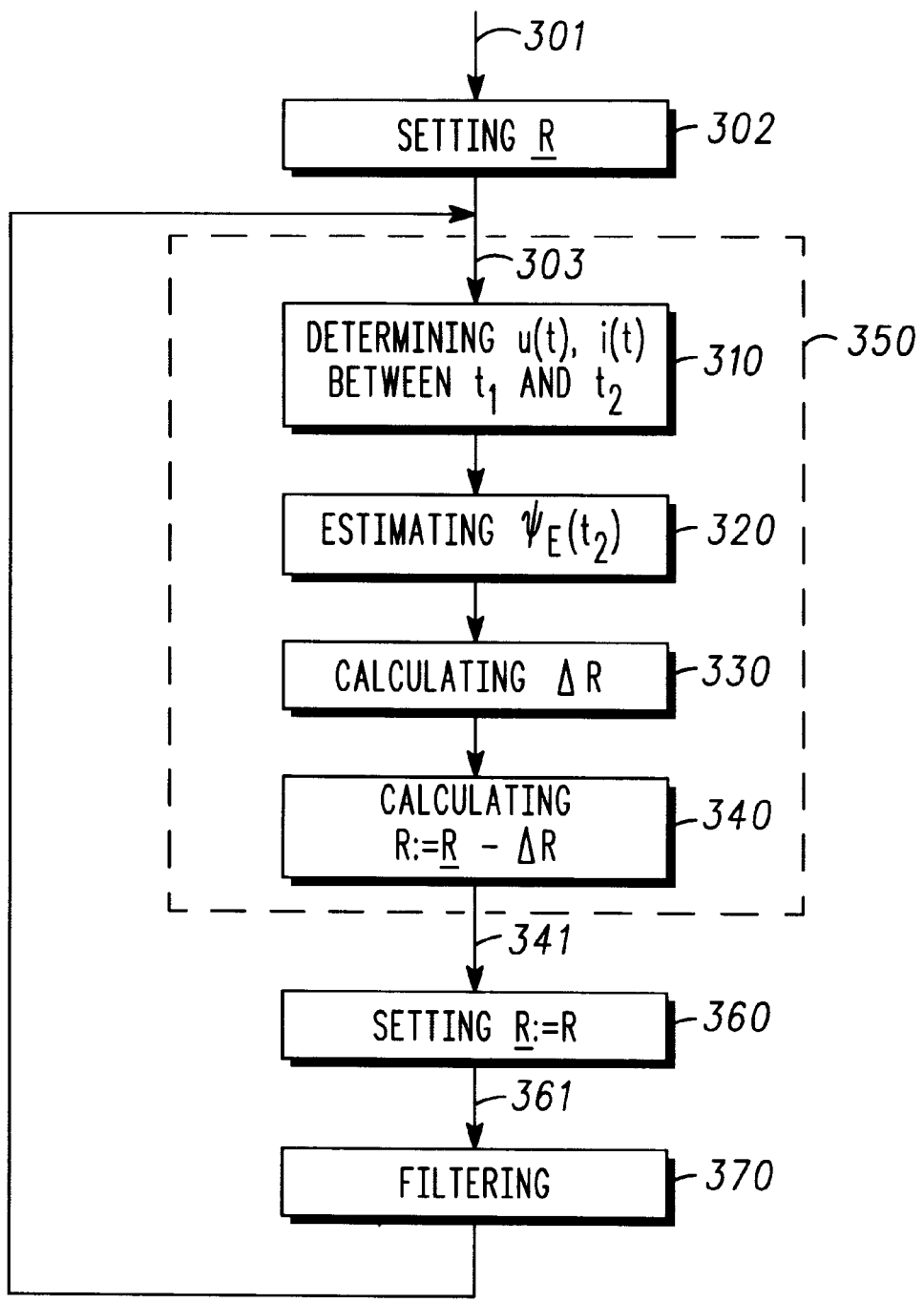
FIG. 4 illustrates a simplified method flow chart diagram of a method to estimate the coil resistance according to the present invention.

FIG. 4 illustrates a simplified method flow chart diagram of method 300 to estimate the coil resistance R according to the present invention. Referring to the single cycle in dashed frame 350, method 300 can shortly be described as a method for estimating the resistance R of a coil (e.g., coil 11) in an electric device (e.g., SRM as motor 10 or any other electromechanical device). Method 300 has at least the following steps: determining 310 voltage u(t) (across coil 11) and current i(t) (through coil 11) in a time interval between time points $t_1$ and $t_2$ when the coil is energized; estimating 320 (cf. equation (4) the magnetic flux $\Psi_E(t_2)$ in coil 11 at time point $t_2$ by integrating over time interval ($t_1,t_2$) the difference between voltage u(t) and the product of current i(t) with a preliminary resistance magnitude (e.g., $\underline{R}$); calculating 330 (equation (14) resistance error $^\Delta R$ as the ratio between the difference from actual flux value $\Psi_A(t_2)$ (e.g., zero or non-zero) to previously estimated value $\Psi_E(t_2)$ at time point $t_2$ and an integral over time interval ($t_1,t_2$) of current i(t); and calculating 340 (equation (15) the resistance R from resistance error $^\Delta R$ and the preliminary resistance $\underline{R}$. Optionally, method 400 can comprise the repetition (line 341, step 360, line 361) of steps 310, 320, 330, 340 wherein the resistance R calculated in step 340 is set (step 360) as preliminary resistance for step 320. Or, method 400 can optionally comprise filtering 370 the resistances R obtained in repetitions.

Method 300 is now explained with more detail for the operation of controller 40. When controller performs method 300 in a single cycle 350, then method starts at line 301 and stops at line 341. Cycle 350 comprises steps 310, 320, 330 and 340 which are, preferably, executed consecutively.

In setting step 302, controller 40 loads $\underline{R}$ which is given by the manufacturer of the motor or determined by automatic calibration in the cold state of the motor (e.g., measuring voltage u(t) and current i(t) across the coil). In determining step 310, sensors 41 and 42 are activated and send u'(t') and i'(t') between $t_1$ and $t_2$ to controller 40. Since controller 40 is also used to switch on and off transistors 31 and 32, controller 40 already has the information when time points $t_1$ and $t_2$ occur. In estimating step 320, controller 40 calculates $\Psi_E(t_2)$ as explained above in connection with diagram 203 and equation (4). Next, in calculating step 330, controller 40 calculates the resistance error $^\Delta R$ as explained in connection with equations (6) to (14). Finally, in calculating resistance step 340, controller 40 calculates R according to equation (15).

In case of a repetition, in following setting step 360, controller 40 takes the resistance R obtained in the previous step as the new preliminary resistance $\underline{R}$, that is:

$$\underline{R} := R \quad (16)$$

Additionally to setting step 360 or as standing alone step, controller 40 can optionally perform filtering 370 the resistance values R which are obtained in each execution of cycle 350.

The present invention can also be described as a computer program product with a computer usable medium (e.g., RAM, ROM, floppy disk, CD-ROM, EPROM, etc.) storing computer readable program code means (e.g., instructions for controller 40) embodied in the medium. The program code means causes controller 40 to estimate the coil resistance by at least executing steps 310, 320, 330 and 340 of method 300.

Figure 5:
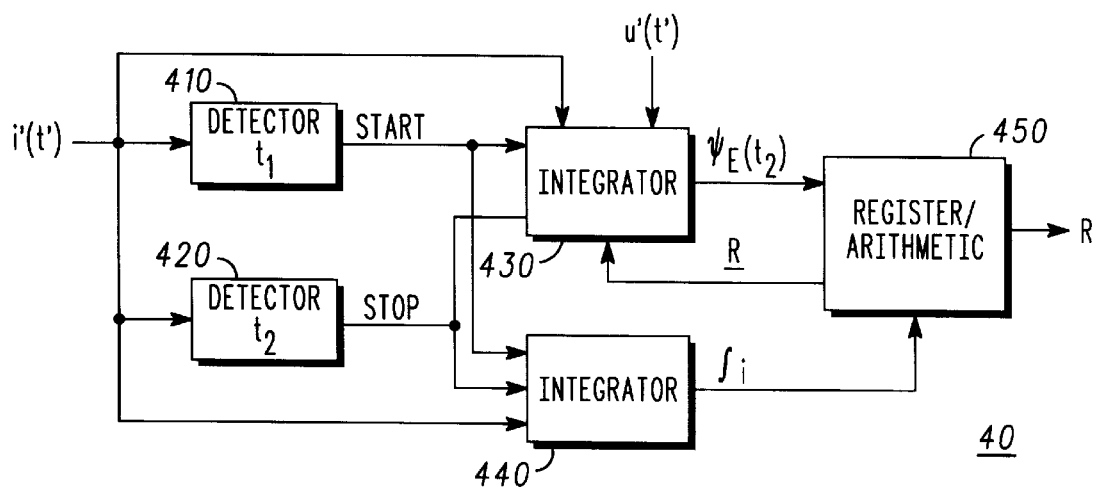
FIG. 5 illustrates a simplified block diagram of a controller operating according to the method of FIG. 4.

FIG. 5 illustrates a simplified block diagram of controller 40 operating according to method 300 of the present invention. FIG. 5 illustrates controller 40 by functional blocks which all can be implemented, for example, in ALU 46 of the microcontroller (cf. FIG. 2). The function of each block can be controlled by a computer program (e.g., stored in carrier 47 or memory 45). Controller 40 comprises detectors 410 and 420, integrators 430 and 440 and register-arithmetic unit 450. Controller 40 receives digital representations i'(t') for the coil current and u'(t') for the coil voltage (e.g., from sensors 42, 41 in FIG. 2) as input signals. Controller 40 provides a digital representation for resistance R as output signal. Other well known functions of controller 40 such as, for example, to switch on and off transistors 31 and 32 (cf. FIG. 2) are well known and therefor not illustrated. FIG. 5 shows a preferred signal flow by arrows between the blocks. Current representation i'(t') goes to detectors 410 and 420 and to integrators 430 and 440; and voltage representation u'(t') goes to integrator 430. Detector 410 detects time point $t_1$ and sends start signals START to integrators 430 and 440; similarly, detector 420 detects time point $t_2$ (cf. definition (2)) and sends stop signal STOP also to integrators 430 and 440. Integrator 430 provides representation $\Psi_E(t_2)$ (cf. steps 310/320, equation (4)) and sends it to unit 450. Integrator 440 provides the current integral ∫idt (cf. term (6.3), equations (13)(14)) and sends it to unit 450. Unit 450 stores a representation for $\underline{R}$ and sends it to integrator 430. Unit 450 further stores $\Psi_A(t_2)$ either according to statements (10) or (12) and calculates $^{\Delta\Psi}(t_2)$, $^\Delta R$ and R accordingly (cf. equations (9), (13), (14), (15)). If method 300 is performed cyclically, then unit 450 performs additional steps like setting 360 and filtering 370.

The present invention can also be described as controller 40 for estimating the coil resistance R in an electric motor, wherein controller 40 receives representations of a voltage u(t) across stator coil 11 and of a current i(t) through coil 11. Controller 40 comprises: means (e.g., unit 450) for storing a preliminary resistance representation $\underline{R}$; means (e.g., integrator 430 in combination with detectors 410 and 420) for estimating the magnetic flux in coil 11 by integrating the difference between the voltage representation and the product of the current representation with the preliminary resistance representation $\underline{R}$ (cf. equation (4)) over a predetermined time interval (i.e., $t_1$, $t_2$) when coil 11 is energized; means (e.g., also unit 450) for calculating a resistance error representation $^\Delta R$ as the ratio between the difference between a representation of an actual flux value at the end (e.g., zero or non-zero) of the time interval (i.e., at $t_2$) and the magnetic flux to the integral of the current representation over the time interval; and means (e.g., unit 450) for calculating the coil resistance R from the preliminary resistance $\underline{R}$ representation and the resistance error representation $^\Delta R$ (cf. equation (15)).

It is an advantage of the present invention that controller 40 can use components which are already available in present motor controllers (like the microcontroller). To estimate the resistance R, a temperature sensor is not required. Controller 40 can monitor changes of R over a number of cycles 350 and calculate a coil temperature T(t) for any time point t by adding a temperature increase $^\Delta T$ (or decrease) to an initial temperature (for example T=20° C. at start-up). Controller 40 can thereby provide the function of an over-temperature protector which modifies (e.g., switches off) the power delievered to the motor when the temperature T(t) exceeds an allowable maximum $T_{MAX}$.

Since the time intervals ($t_1$,$t_2$) for coils 11, 12, and 13 do substantially not overlap, different resistance values $R_{11}$, $R_{12}$, and $R_{13}$, respectively, can be estimated separately, thus improving the accuracy of the position estimation, or improving the changes to detect malfunction of a single coil (e.g., temperature above limit). The different resistance values can also be averaged (e.g., $R_{AVERAGE}=(R_{11}+R_{12}+R_{13})/3$).

The present invention was conveniently described for voltage u(t) measured by voltage sensor 41 between terminals 21 and 22 (cf. FIGS. 1–2). The voltage u(t) can also be derived from voltage $U_{SUPPLY}(t)$ and known switching patterns of the transistors. Without introducing further changes, such an approach would provide the total resistance $R_{TOTAL}$ (coil 11 and transistors 31, 32) instead of R (only coil 11).

While the invention has been described in terms of particular structures, devices and methods, those of skill in the art will understand based on the description herein that it is not limited merely to such examples and that the full scope of the invention is properly determined by the claims that follow.

What is claimed is:

1. Method for estimating the resistance of a coil in an electric device, said method comprising the steps of:
   (a) determining the voltage across said coil and the current through said coil in a time interval between a first time point and a second time point when said coil is energized;
   (b) providing an estimate of the magnetic flux in said coil at said second time point by integrating over said time interval the difference between said voltage and the product of said current with a preliminary resistance;
   (c) calculating a resistance error as the ratio between
      the difference between an actual flux value at said second time point and said estimate and
      an integral over said time interval of said current; and
   (d) calculating said resistance from said resistance error and said preliminary resistance.

2. The method of claim 1 further comprising the repetition of said steps (a), (b), (c) and (d) wherein said resistance calculated in step (d) is set as preliminary resistance for step (b).

3. The method of claim 2 further comprising filtering the resistance in the repetitions.

4. The method of claim 1 applied to a switched reluctance motor.

5. The method of claim 1 applied for each phase of said motor separately.

6. The method of claim 1 wherein said voltage u(t) and said current i(t) are determined by analog-to-digital converters.

7. The method of claim 1 wherein said actual flux value is substantially zero.

8. The method of claim 1 wherein said actual flux value is substantially determined by an magnetic properties of the rotor of said motor.

9. The method of claim 1 where changes of said coil resistance are used to determine a coil temperature.

10. The method of claim 9 wherein the power supplied to said motor is modified when said coil temperature exceeds an predetermined allowable maximum.

11. A controller for estimating the coil resistance in an electric motor, said controller receiving representations of a voltage across a stator coil and of a current through said coil, said controller comprising:
   means for storing a preliminary resistance representation;
   means for estimating the magnetic flux in said coil by integrating the difference between said voltage representation and the product of said current representation with said preliminary resistance representation over a predetermined time interval when said coil is energized;
   means for calculating a resistance error representation as the ratio between (a) the difference between a representation of an actual flux value at the end of said time interval and said magnetic flux and (b) the integral of said current representation over said time interval; and
   means for calculating said coil resistance from said preliminary resistance representation and said resistance error representation.

12. A computer program product with a computer usable medium storing computer readable program code means embodied in said medium, said program code means causing a controller for an electric motor to estimate the resistance of a coil in said motor, by executing the following steps:
   (a) determining the voltage across said coil and the current through said coil in a time interval between a first time point and a second time point when said coil is energized;
   (b) providing an estimate of the magnetic flux in said coil at said second time point by integrating over said time interval the difference between said voltage and the product of said current with a preliminary resistance;
   (c) calculating a resistance error as the ratio between
      the difference between an actual flux value at said second time point and said estimate and
      an integral over said time interval of said current; and
   (d) calculating said resistance from said resistance error and said preliminary resistance.

* * * * *